(12) United States Patent
Donovan et al.

(10) Patent No.: US 8,764,527 B2
(45) Date of Patent: Jul. 1, 2014

(54) METHOD AND APPARATUS FOR PROVIDING COOLING AIR TO EQUIPMENT

(75) Inventors: James E. Donovan, Tewksbury, MA (US); Gary Ware, Newton, MA (US); Carlo Albano, Burlington, MA (US); Michael Falcinelli, Boxford, MA (US)

(73) Assignee: Schneider Electric IT Corporation, West Kingston, RI (US)

( * ) Notice: Subject to any disclaimer, the term of this patent is extended or adjusted under 35 U.S.C. 154(b) by 0 days.

(21) Appl. No.: 11/352,423

(22) Filed: Feb. 10, 2006

(65) Prior Publication Data

US 2007/0190919 A1 Aug. 16, 2007

(51) Int. Cl.
*B60H 1/26* (2006.01)
*F24F 11/00* (2006.01)
*G05B 11/28* (2006.01)

(52) U.S. Cl.
USPC ............................. 454/137; 454/239; 318/599

(58) Field of Classification Search
USPC .................................. 454/137, 239; 318/599
See application file for complete search history.

(56) References Cited

U.S. PATENT DOCUMENTS

| | | | |
|---|---|---|---|
| 2,950,859 A | 8/1960 | Kirk | |
| 4,006,672 A * | 2/1977 | Matsuyoshi et al. | 454/343 |
| 4,120,615 A | 10/1978 | Keem et al. | |
| 4,773,310 A * | 9/1988 | Corwin | 454/244 |
| 4,911,231 A | 3/1990 | Horne et al. | |
| 5,409,419 A | 4/1995 | Euchner et al. | |
| 5,438,226 A * | 8/1995 | Kuchta | 307/125 |
| 5,587,881 A * | 12/1996 | Wang | 361/695 |
| 5,709,100 A | 1/1998 | Baer et al. | |
| 6,015,265 A | 1/2000 | Lasko et al. | |
| 6,036,444 A | 3/2000 | Barney et al. | |
| 6,164,369 A | 12/2000 | Stoller | |
| 6,288,897 B1 | 9/2001 | Fritschle et al. | |
| 6,317,320 B1 | 11/2001 | Cosley et al. | |
| 6,364,618 B1 | 4/2002 | Moreno | |
| 6,406,257 B1 | 6/2002 | Houdek | |
| 6,414,845 B2 | 7/2002 | Bonet | |
| 6,506,111 B2 | 1/2003 | Sharp et al. | |
| 6,695,577 B1 | 2/2004 | Susek | |
| 6,880,349 B2 | 4/2005 | Johnson et al. | |

(Continued)

FOREIGN PATENT DOCUMENTS

JP 11230589 A * 8/1999

OTHER PUBLICATIONS

English translation of JP 11230589. See:http://www4.ipdl.inpit.go.jp/Tokujitu/PAJdetail.ipdl?N0000=60&N0120=01&N2001=2&N3001=H11-230589.*

*Primary Examiner* — Steven B McAllister
*Assistant Examiner* — Helena Kosanovic
(74) *Attorney, Agent, or Firm* — Lando & Anastasi, LLP

(57) ABSTRACT

At least one aspect of the invention is directed to a ventilation device. The ventilation device includes a frame configured to be mounted to a barrier, and a plurality of air moving devices configured to be coupled to the frame and configured to draw air from a first side of the barrier to a second side of the barrier. The ventilation unit further includes a control device coupled to the plurality of air moving devices and configured to detect an out of tolerance condition of one of the plurality of air moving devices and control another one of the plurality of air moving devices to increase airflow though the another one of the plurality of air moving devices in response to the out of tolerance condition.

13 Claims, 12 Drawing Sheets

(56) References Cited

U.S. PATENT DOCUMENTS

| | | |
|---|---|---|
| 7,140,193 B2 | 11/2006 | Johnson et al. |
| D581,510 S | 11/2008 | Albano et al. |
| 2003/0235035 A1 | 12/2003 | Wintersteen et al. |
| 2004/0099747 A1 | 5/2004 | Johnson et al. |
| 2005/0170770 A1 | 8/2005 | Johnson et al. |
| 2005/0225936 A1 | 10/2005 | Day |
| 2005/0237716 A1 | 10/2005 | Chu et al. |
| 2007/0125107 A1 | 6/2007 | Beam |
| 2007/0171613 A1 | 7/2007 | McMahan et al. |
| 2007/0285042 A1* | 12/2007 | Frankel et al. ............... 318/599 |

* cited by examiner

METHOD AND APPARATUS FOR PROVIDING COOLING AIR TO EQUIPMENT

BACKGROUND OF INVENTION

1. Field of Invention

Embodiments of the invention relate generally to devices and methods for cooling a room, such as a wiring closet.

2. Discussion of Related Art

In recent years, with the increasing use of the Internet and networked computer systems for businesses of all sizes, there is an increasing need for additional data center infrastructure to support the power and cooling needs of computer equipment. In the past, typical power consumption for an equipment enclosure in a data facility was on the order of 1 kW. With the use of server blades and other high power density equipment in equipment racks, there is an ever-increasing demand for additional power in equipment racks. Typically, the power consumed by computer equipment is converted to heat and the cooling requirements of computer equipment is generally determined based on the power requirements of the equipment.

Typical large data centers utilize one or more computer room air conditioners (CRACs) or computer room air handlers (CRAHs) to provide cool air for computing equipment. In smaller facilities, computing equipment is often contained in a wiring closet or small room. The cooling for the computing equipment in this case is typically obtained from the facility air conditioning system, but with the increasing power draw of computer equipment, the ducting and distribution of cool air in wiring closets is often inadequate. To overcome these inadequacies, it is common to leave the door of a wiring closet open, which can be undesirable for aesthetic and security reasons. It is also common to have an electrician install a fan to provide greater air flow. These fans are typically standalone devices that are available from an electrical supply company, and are frequently not reliable.

SUMMARY OF INVENTION

At least one aspect of the invention is directed to a ventilation device. The ventilation device includes a frame configured to be mounted to a barrier, a plurality of air moving devices configured to be coupled to the frame and configured to draw air from a first side of the barrier to a second side of the barrier, and a control device coupled to the plurality of air moving devices and configured to detect an out of tolerance condition of one of the plurality of air moving devices and control another one of the plurality of air moving devices to increase air flow though the another one of the plurality of air moving devices in response to the out of tolerance condition.

In the ventilation device, each of the plurality of air moving devices may include a fan having a controllable speed, and the control device may be configured to detect the speed of each fan, and in response to an out of tolerance condition, increase the speed of at least one fan. The control device may be coupled to each of the first fan and the second fan and configured to control each of the first fan and the second fan to provide a predetermined airflow through the ventilation device and upon detection of an out of tolerance condition for the first fan increase the speed of the second fan to substantially maintain the predetermined airflow through the ventilation device. The first side of the barrier may be substantially parallel to the second side of the barrier, and the frame may include a first face plate configured to mount to the first side of the barrier and a second face plate configured to mount to the second side of the barrier. The frame may include a first baffle coupled to the first plate and configured to extend into the barrier from the first side, and the frame may include a second baffle coupled to the second plate and configured to extend into the barrier from the second side. The first baffle and the second baffle may be configured such that the first baffle can be mated to the second baffle within an interior portion of the barrier. In the ventilation unit, each of the fans may be contained within a housing configured to be coupled to the frame. The ventilation device may also include a first bezel configured to be coupled to the first face plate and a second bezel configured to be coupled to the second face plate. The ventilation device may include at least one output connector coupled to the control device, and the control device may be configured to provide at an output connector output signals indicative of at least one operational state of the ventilation device. The control device may be configured to receive input control signals at an output connector and control an operational state of the ventilation device based on the input control signals. In the ventilation unit, the frame may be configured to be adjustable to accommodate barriers of different thicknesses.

Another aspect of the invention is directed to a kit of components for constructing a ventilation unit on a barrier having a first side and a second side with the first side being substantially parallel to the second side. The kit includes a first face plate configured to mount to the first side of the barrier, a second face plate configured to mount to the second side of the barrier, and a fan housing assembly configured to mount to at least one of the first face plate and the second face plate. The fan housing assembly includes a first fan and a second fan each of which has a controllable speed, and a control device coupled to the first fan and the second fan and configured to monitor and control each of the first fan and the second fan to provide a redundant mode of operation wherein speed of the first fan is increased by the control device upon detection of a failure of the second fan.

In the kit, the control device is configured during operation of the ventilation unit to control the first fan and the second fan to maintain a substantially same airflow through the ventilation device before and after failure of one of the first fan and the second fan. The kit can further include a first baffle mountable to the first frame and a second baffle mountable to the second frame, and each of the first baffle and the second baffle can be configured to extend into an interior portion of the barrier during operation of the ventilation unit. The kit may further include a first bezel configured to couple to the first face plate and a second bezel configured to couple to the second face plate, wherein the first bezel is substantially similar to the second bezel.

Another aspect of the invention is directed to a method of mounting a ventilation unit to a barrier, wherein the barrier has a first side and a second side with the first side substantially parallel to the second side, the ventilation unit drawing air through an opening in the barrier. The method includes mounting a first face plate of the ventilation unit to the first side of the barrier, wherein the first face plate includes a first baffle, and wherein mounting the first face plate includes extending the first baffle into the opening in the barrier, mounting a second face plate of the ventilation unit to the second side of the barrier, wherein the second face plate includes a second baffle, and wherein mounting the second face plate includes extending the second baffle into the opening such that the first baffle and the second baffle overlap within the opening and mounting a fan housing to at least one of the first face plate and the second face plate, the fan housing having a plurality of fans configured to draw air through the opening.

The method may further include mating the first baffle with the second baffle, mating a first bezel to the first face plate, and mating a second bezel to the second face plate, wherein the second bezel is substantially the same as the first bezel. The barrier may be a wall or a ceiling of a wiring closet containing electronic equipment including an uninterruptible power supply, and the fan housing may have a power cord, and the method may further include coupling the power cord to the uninterruptible power supply to supply power to the fan housing. The method may further include coupling the controller to the control device and monitoring operation of the plurality of fans using the controller.

Yet another aspect of the invention is directed to a method of controlling operation of a ventilation unit mounted on a barrier to draw air from a first side of the barrier to a second side of the barrier, the ventilation unit have a plurality of fans. The method includes controlling operation of the plurality of fans to draw air from the first side to the second side, detecting an out of tolerance condition with a first one of the plurality of fans, upon detection of the out of tolerance condition, increasing airflow through at least a second one of the plurality of fans.

In the method, controlling operation of the plurality of fans may include controlling the operation to provide a predetermined airflow, detecting a failure of a first one of the plurality of fans, and increasing airflow through a second one of the plurality of fans to maintain the predetermined airflow. In the method, controlling operation may include monitoring and adjusting a speed of each of the plurality of fans. The method may further include providing signals to an external control device, wherein the signals are indicative of an operational state of the ventilation device. The method may include receiving signals from an external controller and changing an operational state of the ventilation device based on the control signals.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
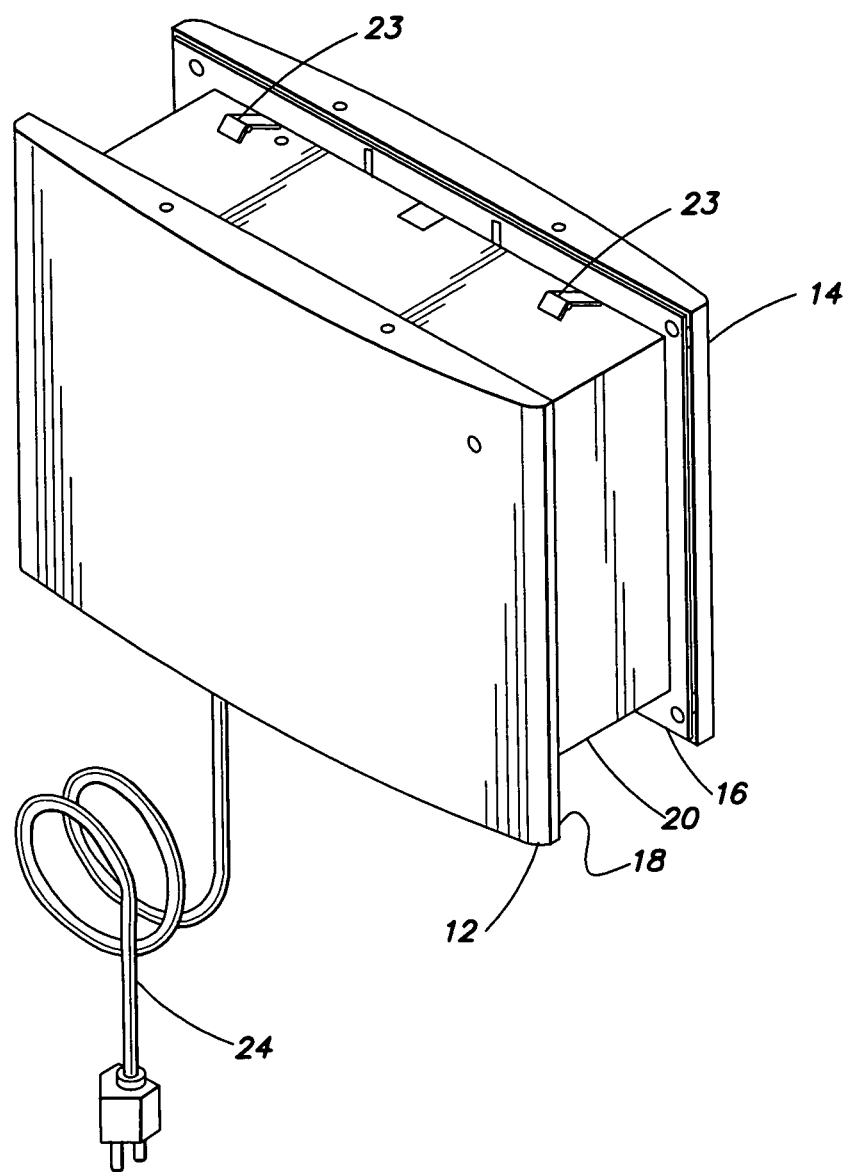
FIG. 1 is a first perspective view of a ventilation device in accordance with one embodiment of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

At least one embodiment of the invention provides a ventilation unit for a wiring closet or other application that includes redundant, variable speed fans having performance monitoring capabilities. As discussed below, the ventilation unit of at least one embodiment may be easily mounted on a barrier, such as a wall, door or ceiling of a wiring closet. Further, ventilation units discussed herein are not limited for use in a wiring closet, but rather, may be used in other rooms or enclosures for which it is desirable to provide a greater flow of air and may be mounted on various types of walls or barriers.

One embodiment of a ventilation unit 10 for use, for example, with a wiring closet containing computer equipment will now be described with reference to FIGS. 1-8. The ventilation unit 10 includes an inside bezel 12, an outside bezel 14, an outside wall plate 16, an inside wall plate 18, an outer baffle 20, an inner baffle 22, a power cord 24, and a fan enclosure housing 26.

The outer baffle 20 is mounted to the outside wall plate using sheet metal screws, and similarly, the inner baffle 22 is mounted to the inside wall plate using sheet metal screws. Each of the inner wall plate and the outer wall plate have four alignment holes 25. As discussed below, the alignment holes are used to align the outside wall plate with the inside wall plate during installation of the ventilation unit.

Figure 3:
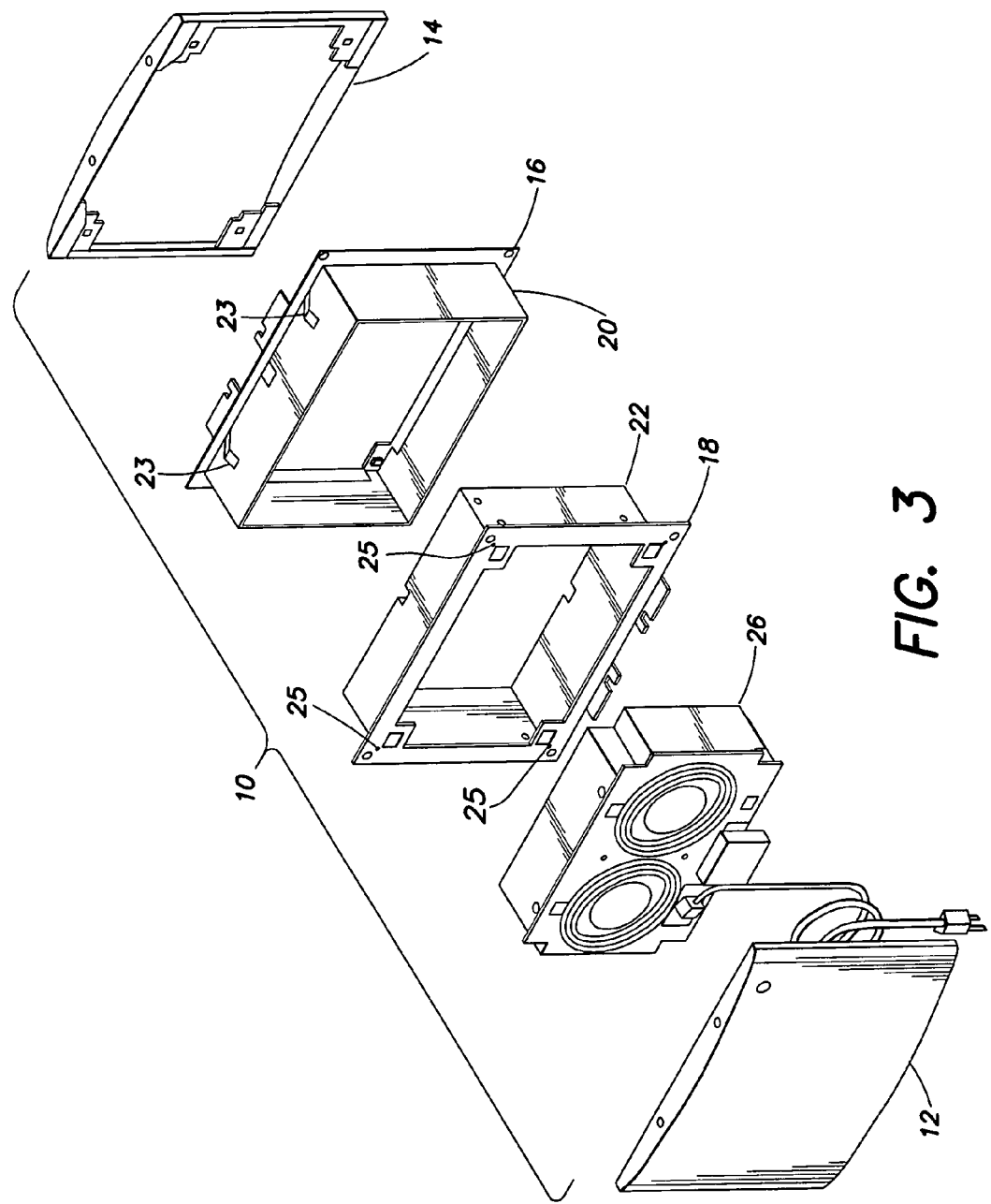
FIG. 3 is an exploded view of the ventilation device of FIG. 1.

As suggested by the exploded view of FIG. 3, the inner baffle 22 fits within the outer baffle 20, and the fan enclosure housing fits within the inner baffle 22. The outer baffle includes four spring mounting clips 23. As described below, the spring mounting clips are used to hold the outside wall plate and outer baffle in place in a barrier during installation of the ventilation unit.

Figure 4:
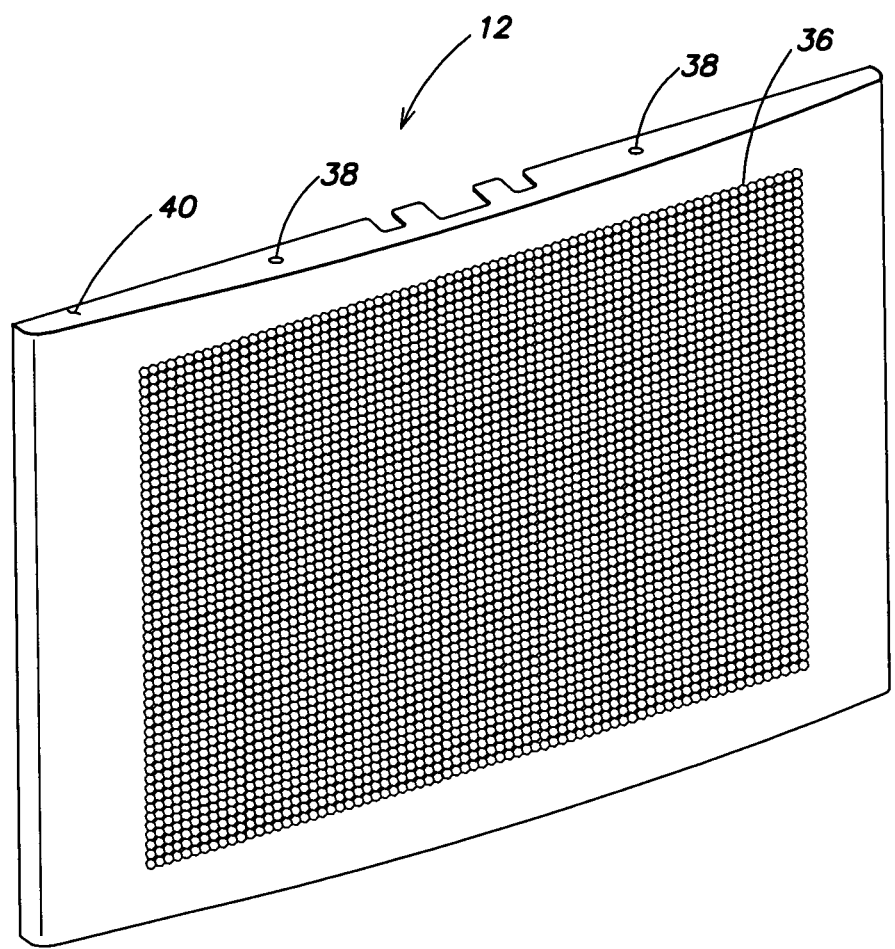
FIG. 4 is a perspective view of a bezel used in the ventilation device of FIG. 1.

The outside bezel 14 mounts to the outside wall plate 16 and the inside bezel 12 mounts to the inside wall plate 18. The inside bezel 12 is shown in greater detail in FIG. 4, and as shown in FIG. 4, the inside bezel includes a plurality of holes to allow airflow through the bezel. The inside bezel also includes mounting holes 38 on a top edge 40 for coupling the inside bezel to the inside wall plate 18 using screws as described below. In one embodiment, the bottom edge of the inside bezel is substantially the same as the top edge 40 and also includes two mounting holes. Further, in at least one embodiment, the outside bezel 16 is the same as the inside bezel, simplifying the manufacturing process of the ventilation unit 10. During use, as described further below, the outside wall plate is mounted to the outside wall of a wiring closet and the inside wall plate is mounted to the inside wall of the wiring closet to draw air from within the wiring closet to the area outside of the wiring closet.

In one embodiment, each of the bezels includes four tabs that are mounted on the back of the bezel and configured to align with four mating clips 58 included on each of the wall plates. The tabs may be pushed into the mating clips to snap into the mating clips to secure the bezels to the wall plates. The use of the tabs allows the bezels to be easily installed and removed. Mounting screws may be used in addition to the tabs when a secure fit is desired, such as for a ceiling mount of the ventilation unit.

In one embodiment, the bezel, wall plates, baffles and the housing for the ventilation unit may be made from steel, however, in other embodiments, other metals could be used, and still in other embodiments, the components may be made from plastic or any other suitable material.

Figure 2:
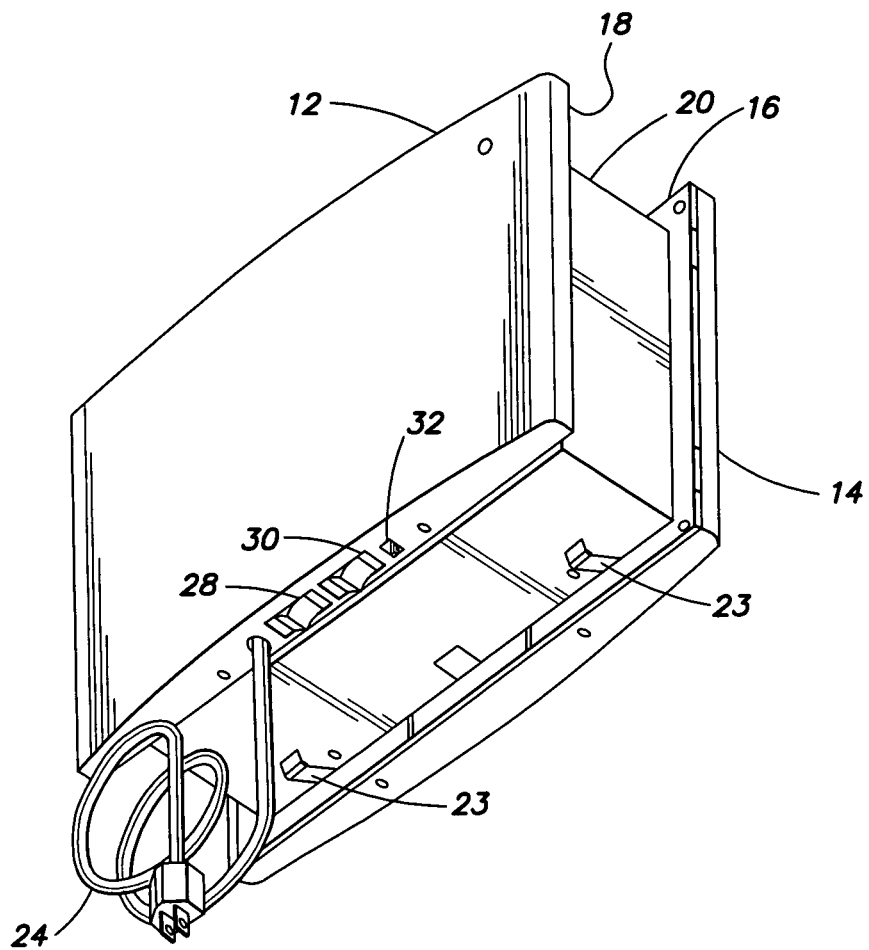
FIG. 2 is a second perspective view of the ventilation device of FIG. 1.

As shown in FIG. 2, the ventilation unit also includes two switches 28 and 30 for manually controlling operation of the ventilation unit as described below. In the embodiment shown, one switch 28 is used to power the unit on and off and the other switch 30 is used to set the speed of the fans to high-speed or low-speed. In at least one other embodiment only one three-position switch having an off position, a high-speed position and a low-speed position is used. The ventilation unit also includes LEDs 34 for providing an indication of operational states and includes an output management connector 32 for coupling to a network or management cable to provide status to a remote device, and in at least some embodiments, the output connector provides for remote control of the ventilation unit. In one embodiment, the output connector 32 is implemented using an RJ-45 type connector.

Figure 5:
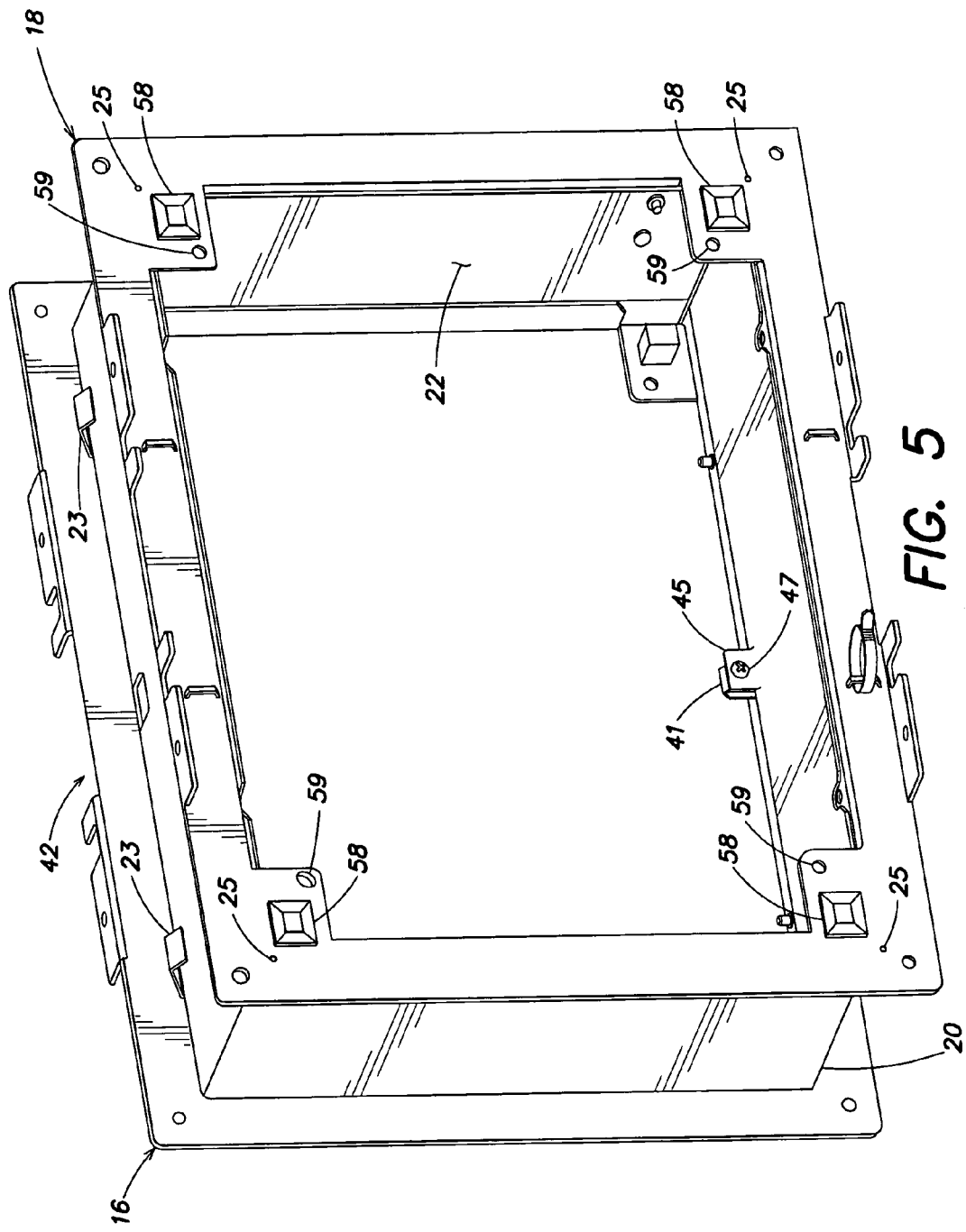
FIG. 5 is a perspective view showing the coupling of an inside baffle to an outside baffle in the ventilation device of FIG. 1.

FIG. 5 shows a portion 42 of the ventilation unit 10 that includes the inside wall plate 18 and inner baffle 22 mounted to the outside wall plate 16 and the outer baffle 20. As shown in FIG. 5, each of the inner baffle 22 and the outer baffle 20 have bottom tabs 41, 45 that are held together when the unit is mounted to a barrier using a screw 47. Each of the inner baffle and the outer baffle also includes upper tabs (not shown) that are held together by a screw. The distance between the two tabs after installation can vary to accommodate different barrier thicknesses, and in one embodiment, the ventilation unit is designed to accommodate wall thicknesses from 4.25 inches to 6.5 inches.

Figure 6:
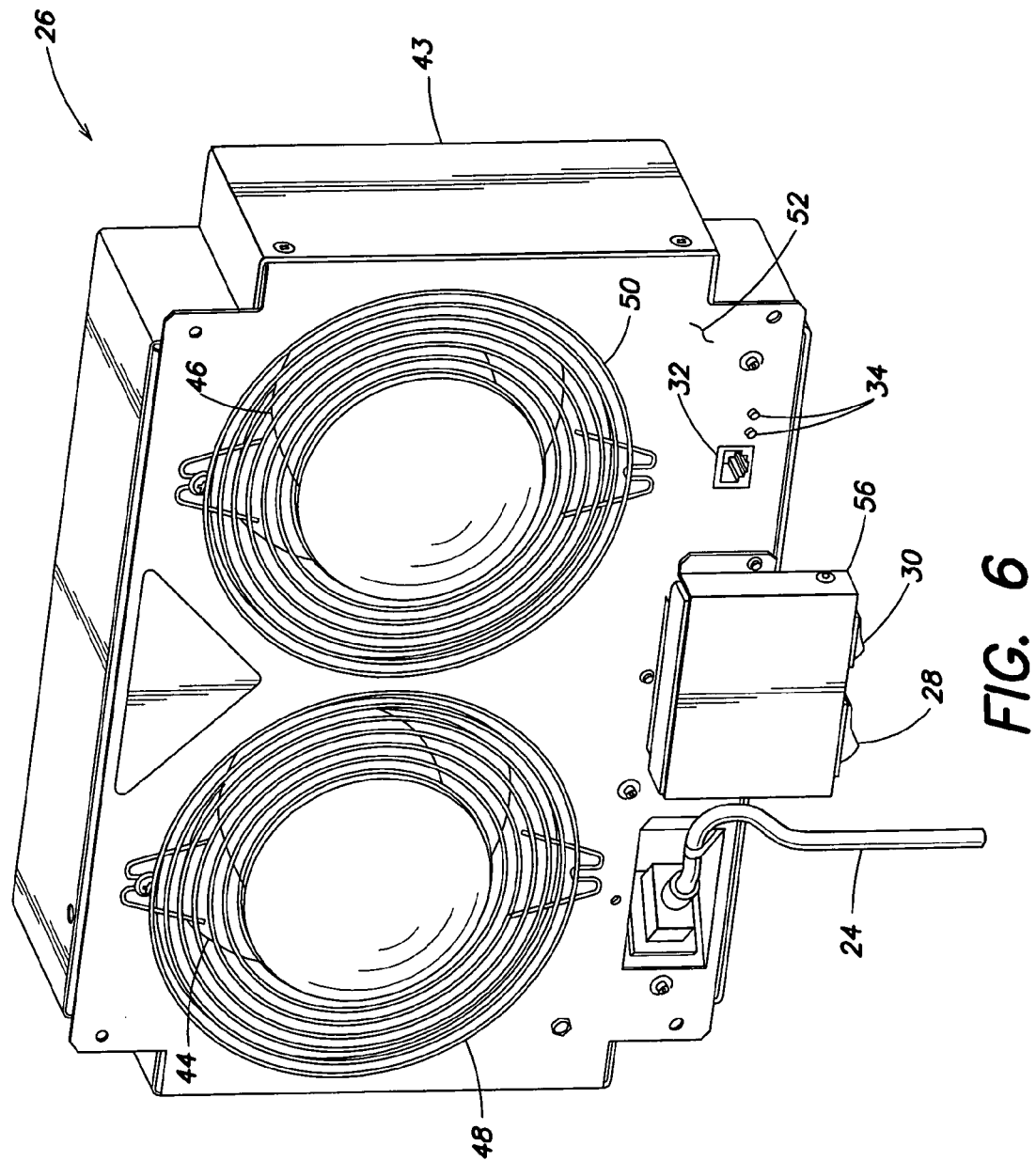
FIG. 6 is a front perspective view of a fan enclosure assembly used in the ventilation device of FIG. 1.
Figure 7:
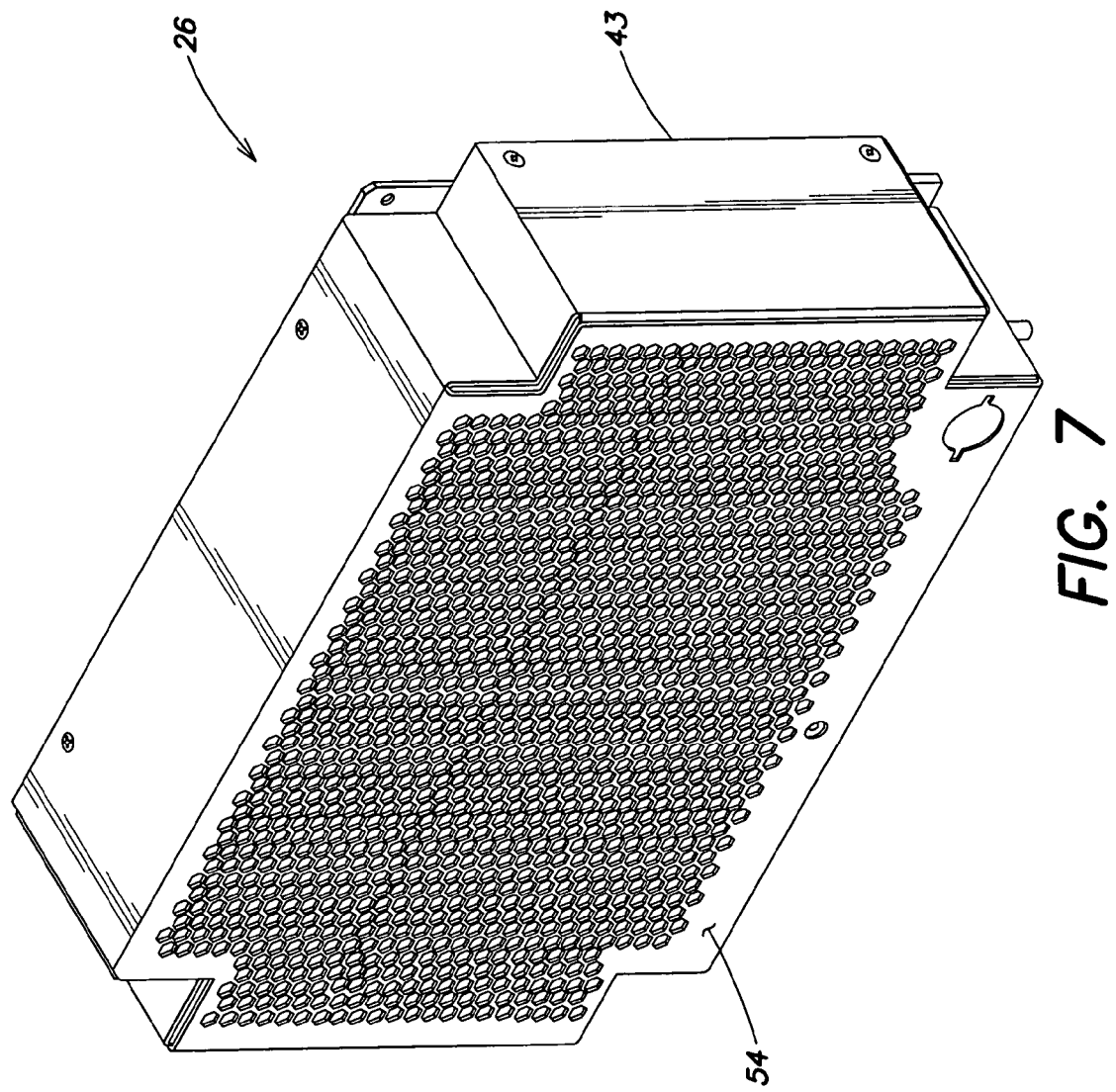
FIG. 7 is a rear perspective view of the fan enclosure assembly of FIG. 6.
Figure 8:
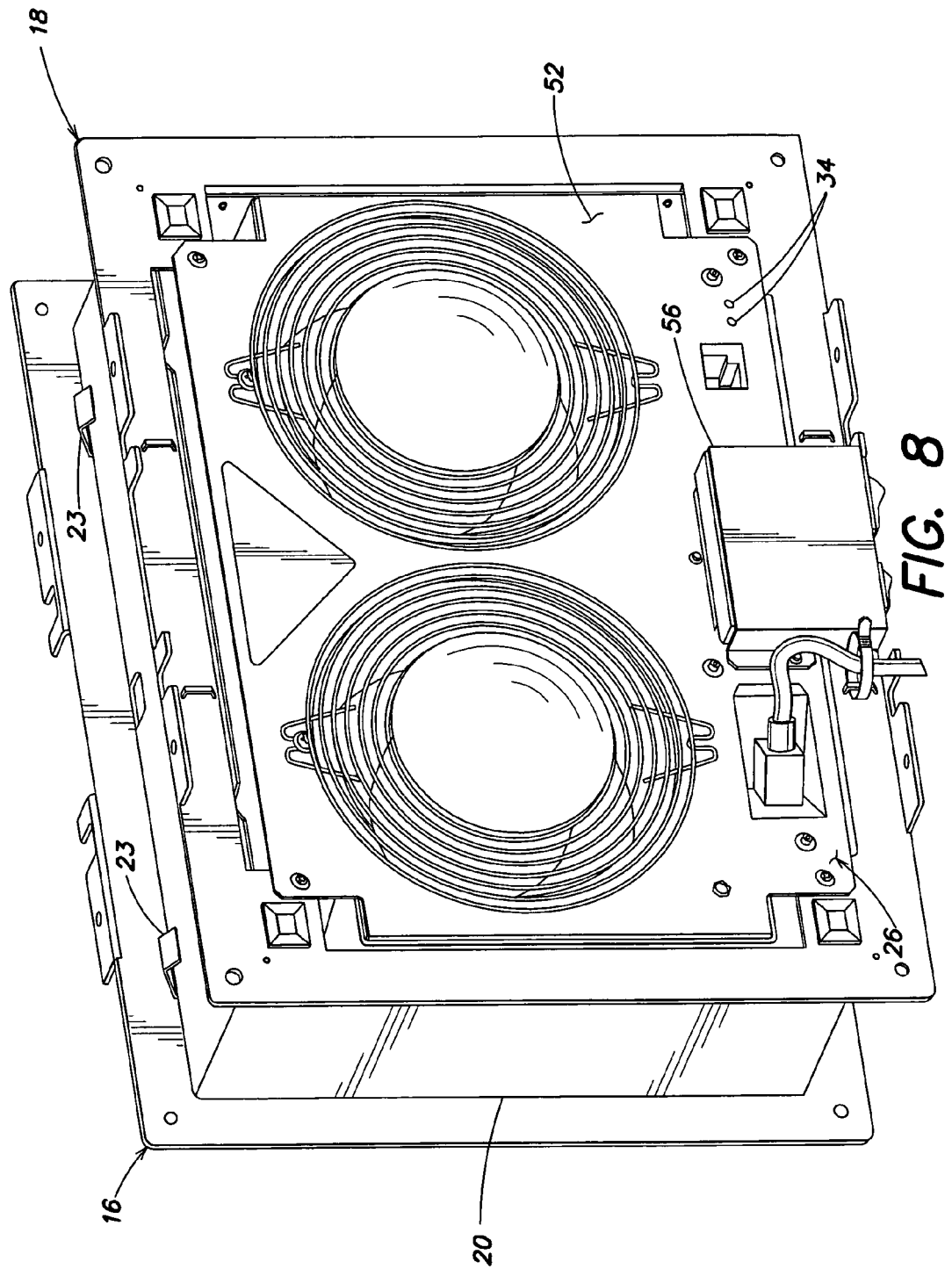
FIG. 8 is a perspective view showing the fan enclosure of FIG. 6 mounted in the assembly of FIG. 5.

The fan enclosure 26 will now be described further with reference to FIGS. 6-8. The fan enclosure includes a steel housing 43 having an inner cover 52 and an outer cover 54. The inner cover has two openings behind which are mounted variable speed fans 44, 46. The openings are covered by grills 48, 50. The outer cover 54 is a perforated panel. In operation, air is drawn by the fans through the openings in the inner cover and exhausted out of the perforated outer cover. Also mounted to the front cover 52 is a control box 56. As discussed below in greater detail, in one embodiment, the control box 56 includes electronics for controlling operation of the fans 44, 46 and for providing output status at the management connector 32. In other embodiments, control electronics are contained in the fan housing as well as in the control box. The fan enclosure is mounted to the inside wall plate 18 at four mounting holes 59 (see FIG. 5) using screws.

In at least one embodiment, the components that comprise the ventilation unit 10, such as shown in FIG. 3, are provided as a kit, and the ventilation unit 10 is assembled in the field as described below.

The ventilation unit 10 may be installed in the ceiling or door of a wiring closet or other room in a manner that will now be described. In at least one embodiment, a ventilation unit may also be installed in a door of a room or in any other barrier or partition in a room. In at least some installations, it may be desirable to install the ventilation unit towards the roof or ceiling to exhaust warm air from a room, and it may be desirable to install a ventilation plate in the door of the room or in some other location closer to the floor of the room to allow cool air to replace the air being exhausted by the ventilation unit.

Figure 9:
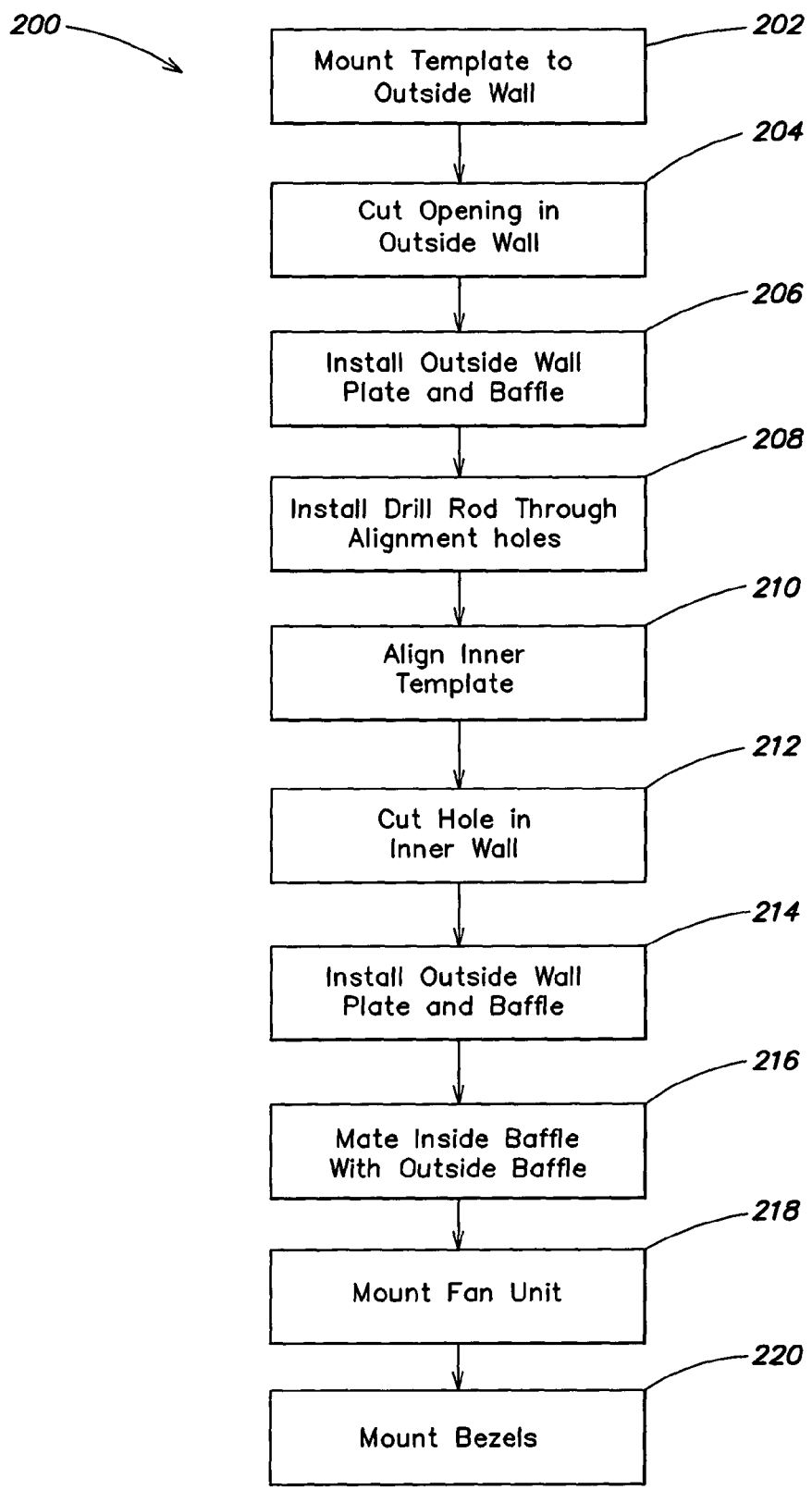
FIG. 9 is a flowchart of a process for installing the ventilation unit of FIG. 1 in accordance with one embodiment.

A process 200 for installing the ventilation unit 10 to a wall of a wiring closet to draw air from outside of the closet to inside the closet will now be described with reference to FIG. 9. In a first stage 202 of the method, a template is mounted to the outside of the wall and held in place using, for example, masking tape. In one embodiment, the template is made of cardboard but in other embodiments thin plastic, paper or other materials may be used for the template. In one embodiment, the template is included with a kit that contains the components for installing the ventilation unit. Using the template, the dimensions for the desired opening on the outside wall can be determined and the opening can be cut out (stage 204) using appropriate tools for the particular wall.

The outside wall plate and outside baffle is then installed in the opening (stage 206). The spring mounting clips 23 (two on the top and two on the bottom) are used to initially hold the outside baffle and the outside wall plate in place in the wall. The use of the spring mounting clips allows the ventilation unit to be easily installed by one person. The number of spring mounting clips may vary in different embodiments. In some embodiments, the inside wall plate may also have spring mounting clips. After inserting the outer baffle in the opening, at stage 208 a drill rod is inserted though the alignment holes 25 of the front plate and is used to drill holes through the wall of the wiring shelter. The holes that are drilled are used as an alignment guide to align an inner template (stage 210) on the inside wall of the wiring shelter. In one embodiment, the drill rod is a stiff wire rod made from stainless steel and has a chisel-like end to easily penetrate sheetrock walls. In other embodiments, the drill rod may be a standard drill bit of sufficient length to extend through the wall. In one embodiment, the inner template is substantially similar to the outer template, and the inner template and the drill rod may be included with the kit described above.

The inner template is used to cut out a hole on the inner wall (stage 212), and the inner baffle and inner wall plate are inserted (stage 214) into the opening from inside the wiring closet with the inner baffle extending into the outer baffle. The upper tabs and lower tabs 41, 45 (see FIG. 5) are then screwed together (stage 216) compressing the outer wall plate 16 and the inner wall plate 18 against the wall and holding the plates and baffles in place in the wall, without the need to align the ventilation 10 to wall studs and/or use wall anchors.

Figure 10A:
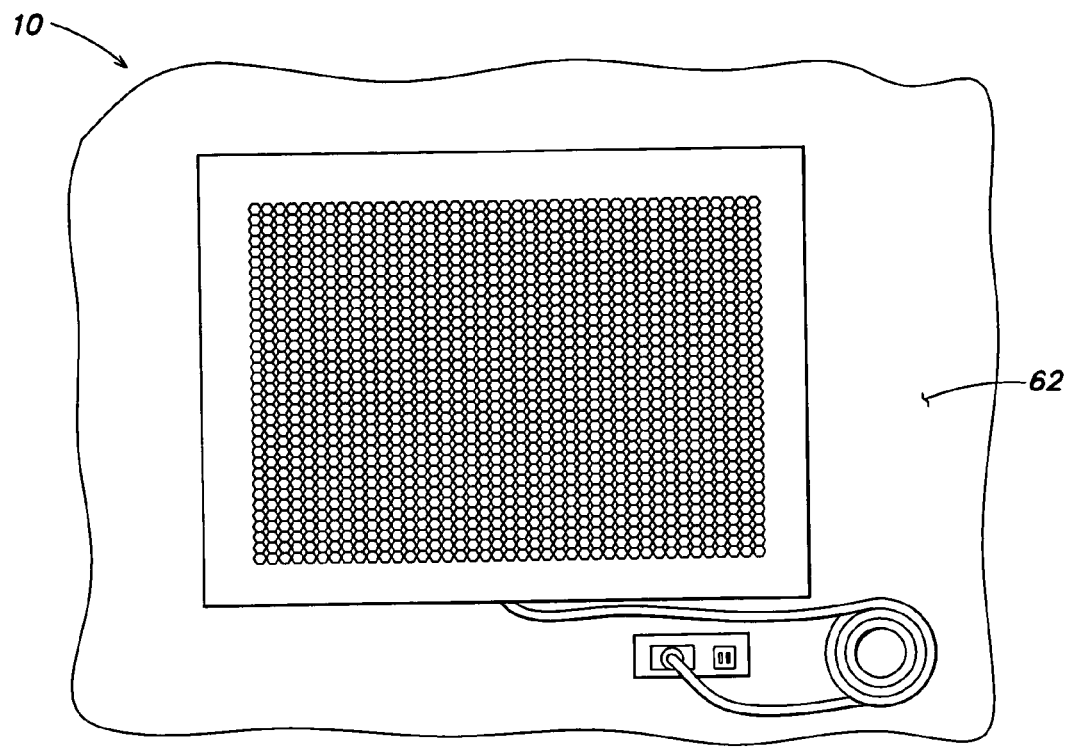
FIG. 10A shows the ventilation unit of FIG. 1 mounted to an internal wall of a wiring closet.
Figure 10B:
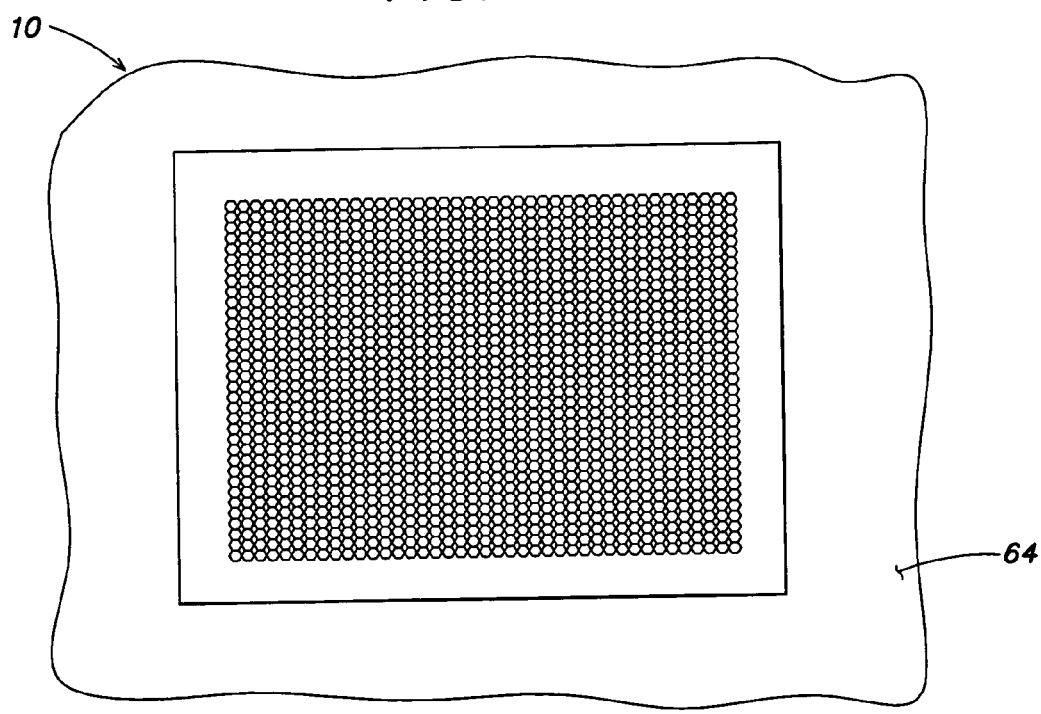
FIG. 10B shows the ventilation unit of FIG. 1 mounted to an external wall of a wiring closet.

After installation of the wall plates and baffles, the heavier fan enclosure can be easily mounted (stage 218) to the inside wall plate at the mounting holes 59 of the inside wall plate. The inside bezel 12 and the outside bezel 14 are then mounted (stage 220) respectively to the inner wall plate and the outer wall plate to complete installation of the ventilation unit. FIGS. 10A and 10B show the ventilation unit mounted to a wall of a wiring closet, with FIG. 1OA showing the inside wall 62 of the wiring closet and FIG. 10B showing the outside wall 64 of the wiring closet.

Once the ventilation unit is installed on the wall of the wiring closet, the power cord 24 may be plugged into a wall outlet in the wiring closet or may be plugged into a power distribution unit or uninterruptible power supply to supply power to the ventilation unit. Also, a network cable may be coupled to the management cable connector 32 and to a status monitoring device within the wiring closet to monitor the status of the ventilation unit, and in some embodiments to provide control signals to the ventilation unit.

As discussed above, when the ventilation unit is installed in a wall or ceiling of a wiring closet to exhaust warm air from the wiring closet, it may be desirable to also install an intake grill at another location in the wiring closet to allow cool air to enter the wiring closet. In one embodiment, a second ventilation unit 10, without the fan enclosure 26, may be used as the intake grill and installed in the manner described above. For situations in which it is desirable to mount the intake grill on a door or other thin wall, the inside baffle and the outside baffle may be removed from the inside wall plate and the outside wall plate.

In at least one embodiment of a ventilation unit that is provided as a kit, an additional inside wall plate 18, outside wall plate 16, outer baffle 20, inner baffle 22, inside bezel 12 and outside bezel 14 may be included in the kit and mounted using the installation process 200 (except for mounting the fan enclosure at stage 218) to install an intake grill.

Figure 11:
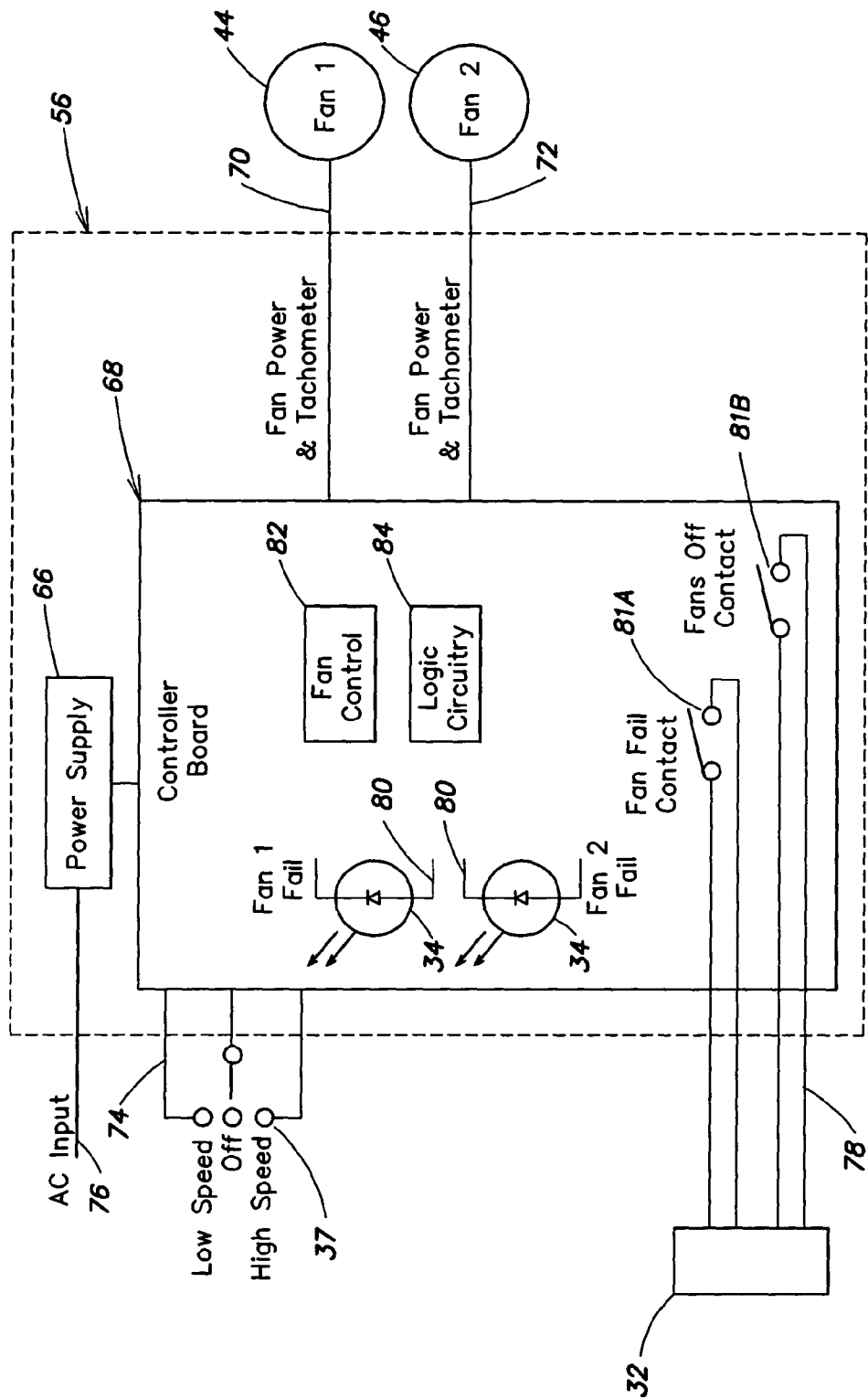
FIG. 11 is a functional block diagram of the ventilation device of FIG. 1.
Figure 12:
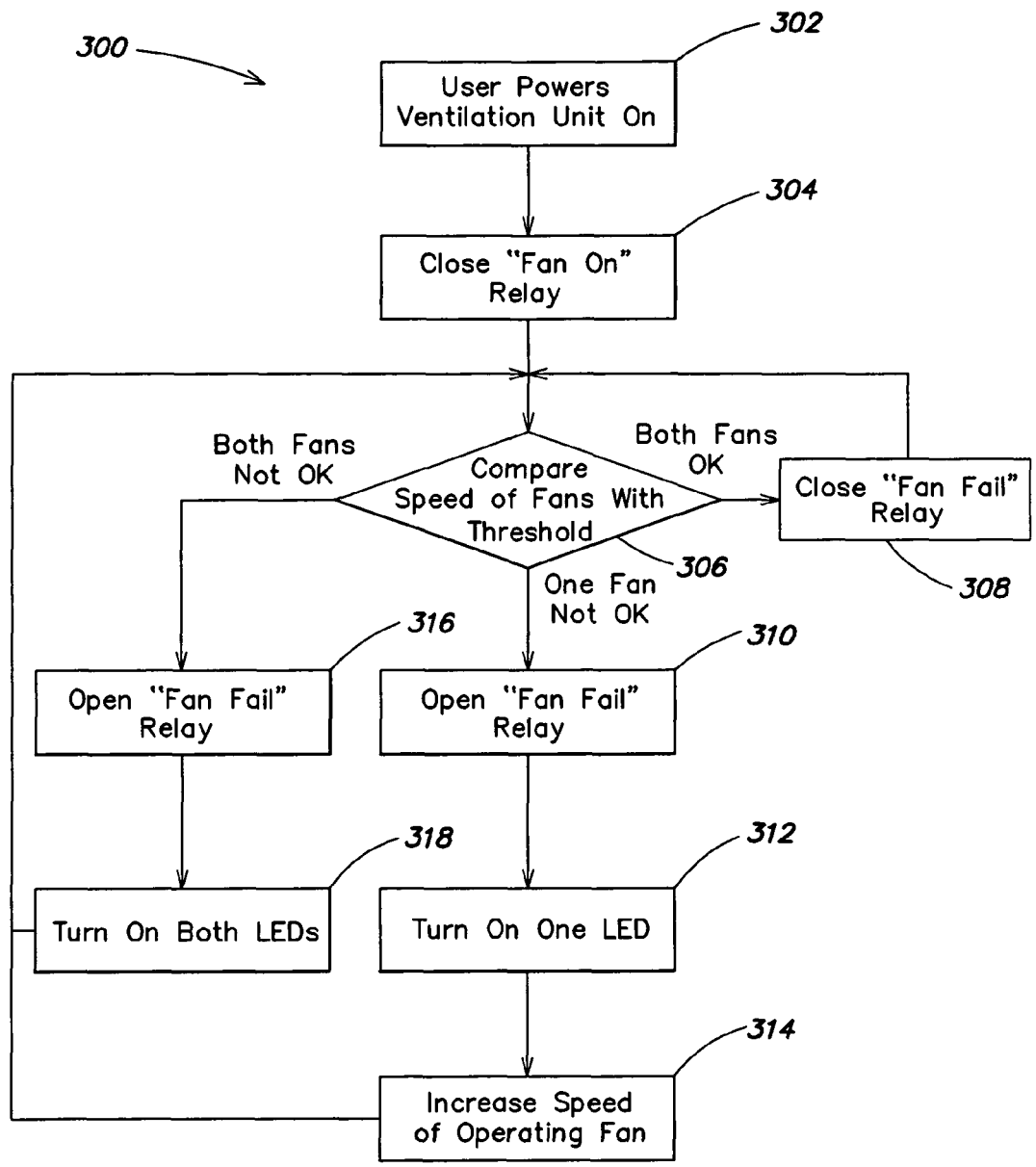
FIG. 12 is a flow chart demonstrating operation of the ventilation device in accordance with one embodiment of the invention.

The control box 56 used in at least one embodiment will now be described further with references to FIGS. 11 and 12. FIG. 11 provides a functional block diagram of the ventilation unit, and FIG. 12 provides a flowchart of a control process 300 used in one embodiment. The control box 56 includes an AC/DC power supply 66, a controller board 68, fan I/O lines 70, 72, switch lines 74, AC input lines 76, management I/O lines 78, and diode control lines 80.

The AC/DC power supply 66 couples to the input power cord 24 using AC input lines 76. In one embodiment, the AC/DC power supply has a 100 to 230 volt AC input and provides a 24 volt DC, 65 watt output to the controller board for power of components on the controller board and to provide power to the fans.

The switch lines 74 couple the control board to a switch 37. In the embodiment shown in FIG. 11 only one three-position switch having low-speed, off, and high-speed positions is used. The fan I/O lines 70, 72 couple each of the fans to the controller board. In one embodiment, each of the fans is implemented using a fan from Delta Electronics having part no. EFB1524SHG, and in this embodiment, a dc power line and return is provided to each of the fans from the controller board and a speed or tachometer line is provided from each fan to the controller board. In this embodiment, the controller board provides a regulated variable voltage to each fan to control the speed of the fan, and each fan provides a speed signal to the controller board to allow the controller board to determine the speed of each fan. The diode control lines 80 are used to turn on one or both of the LED's to indicate a failure of one or both of the fans.

The management I/O lines couple the management cable connector 32 to the controller board. As shown in FIG. 11, in one embodiment, the controller board includes two relays 81A and 81B, each of which is coupled to the connector 32 and has a control line coupled to the logic circuitry on the controller board. In this embodiment, the management I/O cables can provide signals to an external device indicating status of the ventilation unit. In one embodiment, one relay (designated "Fan On Relay") is used to indicate (with a closed position) that the ventilation unit is turned on, and the other relay (designated "Fan Fail Relay") is used to indicate whether either fan has failed, with the open position indicating a fan failure. The use of an open circuit to indicate failure allows a remote monitor to detect not only a failed fan, but also a complete loss of AC to the ventilation unit, failures of circuitry on the controller board, and a broken connection in the management lines.

The controller board includes fan speed control circuitry 82 and logic circuitry 84, and in addition, the relays and LED's 34 may be contained on the controller board. In one embodiment, the controller board and power supply are contained in the fan housing rather than the controller box. In one embodiment, the fan speed control circuitry receives signals from the logic circuitry that indicate whether each of the fans should be operated at high speed, low speed or at a fail speed. Based on the received signals, the fan control circuitry 82 provides a regulated output voltage of approximately 12 volts for low speed, 18 volts for high speed and 24 volts for fail speed. Fail speed is used in some embodiments to increase air flow upon failure of one of the fans.

The logic circuitry 84 provides output signals to the LED's, the relays, the fan speed control circuitry, and the management connector. The logic circuitry also receives inputs from the switch to determine the switch position and from the fans to determine speed of the fans.

Operation of the ventilation unit 10 will now be further described with reference to FIG. 12, which is a flow chart of an operational process 300 in accordance with one embodiment. In a first stage 302 of the process, after installation of the ventilation unit, a user initially powers the ventilation unit "ON" by choosing either the low-speed or high-speed position of the switch. In one embodiment, the low speed position of the switch results in an airflow of approximately 160 CFM (cubic feet per minute) for each fan for a total of 320 CFM, and the high speed position results in an airflow of approximately 240 CFM per fan for a total air flow of 480 CFM. In this embodiment, when operated at the fail speed, each fan can provide approximately 320 CFM. In other embodiments, other fans may be used to provide other airflow rates.

Upon detection of the change in switch position, the Fan On relay is closed and the logic circuitry provides output signals to the fan control circuitry to operate the fans at the desired speed. At stage 306, the logic circuitry detects the speed of each of the fans, and compares the speed with a threshold value to determine if each of the fans is operating at the selected speed. If the fans are operating at the proper speed, then at stage 308, the logic circuitry provides power to the relays to close the "Fan Fail" relay. The closure of the relay provides a signal to an external device that the fans are operational. The process then returns to stage 306. If the result of the comparison at stage 306 indicates that one of the fans is operating below the speed threshold, then at stage 310, the Fan Fail relay is opened, one LED is turned on (stage 312) and at stage 314, the speed of the other fan is increased to the fail speed. The process then returns to stage 306. If both fans are not operational at stage 306, then at stage 316, the Fan Fail relay is opened, both LED's are turned on (stage 318) and the process returns to stage 306.

In the process 300 described above, in low-speed of operation, the ventilation unit 10 provides complete redundancy for the fans, such that the full airflow of 320 CFM can be provided after failure of one of the fans. Further, in high-speed operation, sufficient redundancy is provided such that approximately ⅔ of the fully operational airflow can still be provided after failure of one of the fans. The use of two fans in the modes of operation described provides advantages in addition to redundancy. The use of two fans allows each of the fans to operate at a lower speed to achieve a desired airflow, resulting in less noise and longer expected life for each of the fans.

In embodiments of ventilation units described above, output status signals are provided. In different embodiments, these status signals may be coupled to any of a number of status monitor devices, rack manager devices and environmental monitors located, for example, in a wiring closet to initiate alarms and/or notify users. These status monitor devices include for example, those available from American Power Conversion (APC) Corporation of West Kingston, R.I., including the ISX Manager product.

In at least one embodiment discussed above, logic circuitry and simple relays are used to monitor, control and report status of a ventilation unit. In other embodiments, the logic circuitry may be replaced with more sophisticated circuitry and/or a microprocessor. In such embodiments, the ventilation unit may include a more intelligent network communications interface, allowing two-way communications with various devices over various networks using any of a number of protocols readily known to the those of skill in the art, including both proprietary and public protocols. When two-way communication is provided, an external controller/manager may determine actual RPM, inlet temperature, measure voltages, determine accumulated run-time and other factors that can assist in predicting a fan's life expectancy allowing for a fan to be replaced prior to an actual failure.

In the description of embodiments of the invention described herein, the term baffle is used to generally describe a portion of a ventilation unit housing, and this term is not limited to any specific structure described herein.

In at least some embodiments described above, a ventilation unit for mounting to a barrier, such as a ceiling, wall, partition or a door of a computer room or wiring closet is provided to provide cooling air into the room or the closet or to exhaust warm air from the room or the closet. In other embodiments, the ventilation unit may be mounted directly to an equipment rack, a computing device or other electronic device, or to a partition contained within a room or a closet. Further, while at least one embodiment is described for use for cooling electronic equipment, ventilation units may be used for any other application in which it is desired to provide airflow into or out of a room or closet.

In at least some embodiments, ventilation units include fans for drawing air from one side of a barrier to another, in other embodiments, as readily understood by those of skill in the art based on this disclosure, other air moving devices, such as blowers could be used in place of the fans.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A ventilation device comprising:
a frame configured to be mounted to a barrier;
a plurality of air moving devices configured to be coupled to the frame and configured to draw air from a first side of the barrier to a second side of the barrier; and
a control device coupled to the plurality of air moving devices and configured to detect an out of tolerance condition of one of the plurality of air moving devices and control another one of the plurality of air moving devices to increase airflow though the another one of the plurality of air moving devices in response to the out of tolerance condition;
wherein the frame includes a first face plate configured to mount to the first side of the barrier and a second face plate configured to mount to the second side of the barrier;
wherein the frame includes a first baffle fixed to the first face plate and configured to extend into the barrier from the first side;
wherein the frame includes a second baffle fixed to the second face plate and configured to extend into the barrier from the second side, and wherein the first baffle and the second baffle are configured such that a portion of the first baffle extends into the second baffle and such that the portion of the first baffle can be mated to the second baffle within an interior portion of the barrier.

2. The ventilation device of claim 1, wherein each of the plurality of air moving devices includes a fan having a controllable speed, and wherein the control device is configured to detect the speed of each fan, compare the speed of each fan with a threshold value to determine an out of tolerance condition, and in response to the out of tolerance condition, increase the speed of at least one fan.

3. The ventilation device of claim 1, wherein the plurality of air moving devices includes a first fan and a second fan each having a controllable speed, and wherein the control device is coupled to each of the first fan and the second fan and configured to control each of the first fan and the second fan to provide a predetermined airflow through the ventilation device and upon detection of an out of tolerance condition for the first fan increase the speed of the second fan to substantially maintain the predetermined airflow through the ventilation device.

4. The ventilation device of claim 3, wherein each of the fans is contained within a housing configured to be coupled to the frame.

5. The ventilation device of claim 4, further comprising a first bezel configured to be coupled to the first face plate and a second bezel configured to be coupled to the second face plate.

6. The ventilation device of claim 5, further comprising at least one output connector coupled to the control device, and wherein the control device is configured to provide at the at least one output connector output signals indicative of at least one operational state of the ventilation device.

7. The ventilation device of claim 6, wherein the control device is configured to receive input control signals at the at least one output connector and to control an operational state of the ventilation device based on the input control signals.

8. The ventilation device of claim 1, wherein the frame is configured to be adjustable to accommodate barriers of different thicknesses.

9. The ventilation device of claim 1, wherein the first baffle and the second baffle are configured such that when mated, the first and second baffle overlap by an amount that is adjustable to accommodate barriers having different thicknesses.

10. The ventilation device of claim 1, further comprising a first bezel configured to be coupled to the first face plate and a second bezel configured to be coupled to the second face plate.

11. The ventilation device of claim 1, further comprising at least one output connector coupled to the control device, and wherein the control device is configured to provide at the at least one output connector output signals indicative of at least one operational state of the ventilation device.

12. The ventilation device of claim 11, wherein the control device is configured to receive input control signals at the at least one output connector and to control an operational state of the ventilation device based on the input control signals.

13. The ventilation device of claim 1, wherein the first baffle includes a first tab, the second baffle includes a second tab, and wherein the first and second tabs are configured and arranged to be fastened together to mate the first baffle to the second baffle.

* * * * *